(12) United States Patent
Shim

(10) Patent No.: US 7,710,102 B2
(45) Date of Patent: May 4, 2010

(54) CLOCK TEST APPARATUS AND METHOD FOR SEMICONDUCTOR INTEGRATED CIRCUIT

(75) Inventor: Young Bo Shim, Ichon (KR)

(73) Assignee: Hynix Semiconductor Inc. (KR)

( * ) Notice: Subject to any disclaimer, the term of this patent is extended or adjusted under 35 U.S.C. 154(b) by 298 days.

(21) Appl. No.: 11/964,776

(22) Filed: Dec. 27, 2007

(65) Prior Publication Data

US 2008/0218230 A1   Sep. 11, 2008

(30) Foreign Application Priority Data

Mar. 8, 2007 (KR) .................. 10-2007-0022959
Apr. 12, 2007 (KR) .................. 10-2007-0035825

(51) Int. Cl.
*G01R 23/12* (2006.01)
(52) U.S. Cl. ............... 324/76.52; 324/76.53; 324/76.54
(58) Field of Classification Search ............... 324/76.52, 324/76.53, 76.54
See application file for complete search history.

(56) References Cited

U.S. PATENT DOCUMENTS

| | | | |
|---|---|---|---|
| 5,263,031 A | 11/1993 | Inoue | |
| 5,687,180 A | 11/1997 | Kawasaki | |
| 5,901,105 A | 5/1999 | Ong et al. | |
| 6,452,849 B1 * | 9/2002 | Iwamoto | 365/201 |
| 6,940,765 B2 | 9/2005 | Kyung | |
| 2006/0192602 A1 * | 8/2006 | Lee | 327/158 |

FOREIGN PATENT DOCUMENTS

| | | |
|---|---|---|
| JP | 09106698 | 4/1997 |
| JP | 2005071582 | 3/2005 |
| KR | 10-1998-0041606 | 8/1998 |
| KR | 1020020012710 | 2/2002 |
| KR | 1020030018627 | 3/2003 |
| KR | 1020060083014 A | 7/2006 |
| KR | 10-0706623 | 4/2007 |

* cited by examiner

*Primary Examiner*—Vincent Q Nguyen
(74) *Attorney, Agent, or Firm*—Baker & McKenzie LLP

(57) ABSTRACT

A clock test apparatus for a semiconductor integrated circuit includes a delay unit configured to delay an internal clock signal. A comparison unit compares the phase of an output signal of the delay unit with the phase of a reference clock signal. A phase discrimination unit receives a test mode signal, the reference clock signal, and an output signal of the comparison unit, thereby outputting a discrimination signal.

25 Claims, 6 Drawing Sheets

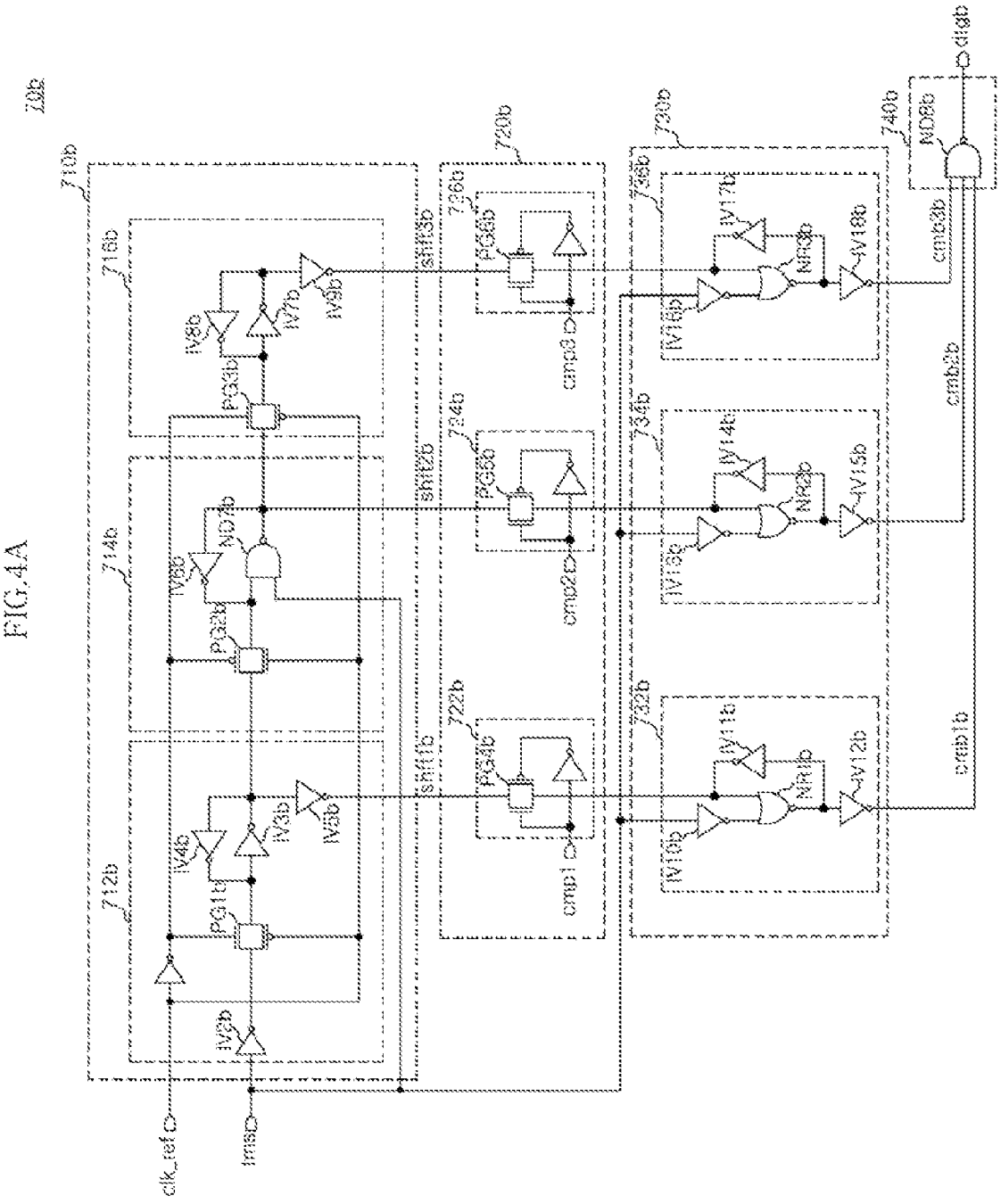

CLOCK TEST APPARATUS AND METHOD FOR SEMICONDUCTOR INTEGRATED CIRCUIT

CROSS-REFERENCE TO RELATED PATENT APPLICATION

This application claims the benefit under 35 U.S.C. 119(a) of Korean Patent Application No. 10-2007-0022959, filed on Mar. 8, 2007, and 10-2007-0035825, filed on Apr. 12, 2007, in the Korean Intellectual Property Office, the disclosure of which are both incorporated herein in their entirety by reference as if set forth in full.

BACKGROUND

1. Technical Field

The embodiments described herein relate to semiconductor integrated circuits, and in particular, clock test apparatus and methods for determining an internal clock signal delay.

2. Related Art

Generally, a semiconductor integrated circuit, such as an SDRAM (Synchronous Dynamic Random Access Memory), uses an external clock signal to control the operation of the circuit. The external clock signal is often used to generate a data output clock signal within the circuit, and the data output clock signal often controls the operation of a data output buffer. It will also be understood that other internal clock signals can be generated based on such an external clock signal.

Such an internal clock signal is often delayed from relative to the external clock signal due to delay introduced by, e.g., a clock input buffer and individual transmission lines within the circuit. Thus, the interval clock signal is often out of phase with the external clock signal. When the internal clock and the external clock are out of phase, the circuits operational speed can be reduced, and at worst, a data output operation may not performed. In order to solve this problem, conventional circuits often use a DLL (Delay Locked Loop) circuit or a PLL (Phase Locked Loop) circuit to correct the delay of the internal clock relative to the external clock.

At present, however, even if the delay is corrected, it may not be possible to test the data output operation while in a wafer state. Accordingly, the data output operation is often tested after the package process to determine a difference in phase between the internal clock and the external clock. At this stage, however, it is too late to fix the circuit and the circuit cannot be used if in fact their is a problem. This lowers yields and obviously increases costs.

SUMMARY

A clock test apparatus for a semiconductor integrated circuit can test a difference in phase between an internal clock and an external clock in a wafer state.

In one aspect, a clock test apparatus for a semiconductor integrated circuit includes: a delay unit configured to delay an internal clock; a comparison unit configured to compare the phase of an output signal of the delay unit with the phase of a reference clock signal; and a phase discrimination unit configured to receive a test mode signal, the reference clock signal, and an output signal of the comparison unit, thereby outputting a discrimination signal.

In another aspect, provides a clock test apparatus for a semiconductor integrated circuit includes: a first delay unit configured to delay an internal clock by a first delay value to generate a first delay clock signal; a second delay unit configured to delay the internal clock by a second delay value to generate a second delay clock signal; a first comparison unit configured to compare the phase of the first delay clock signal with the phase of a reference clock signal, thereby outputting a first comparison signal; a second comparison unit configured to compare the phase of the second delay clock signal with the phase of the reference clock signal, thereby outputting a second comparison signal; and a phase discrimination unit configured to detect a change in level of each of the first comparison signal and the second comparison signal, thereby discriminating a difference in phase between the reference clock signal and the internal clock.

In still another aspect, a clock test apparatus for a semiconductor integrated circuit including: a first delay unit configured to delay an internal clock to generate a first delay clock signal; a second delay unit configured to delay the first delay clock signal to generate a second delay clock signal; a first comparison unit configured to compare the phase of the first delay clock signal with the phase of a reference clock signal, thereby outputting a first comparison signal; a second comparison unit configured to compare the phase of the second delay clock signal with the phase of the reference clock signal, thereby outputting a second comparison signal; and a phase discrimination unit configured to detect a change in level of each of the first comparison signal and the second comparison signal, thereby discriminating a difference in phase between the reference clock signal and the internal clock.

The phase discrimination unit can include: a shifter unit configured to shift a test mode signal in response to the reference clock signal, and to generate a first shift signal and a second shift signal based thereon; a switch unit configured to selectively output the first shift signal or the second shift signal in response to the first comparison signal and the second comparison signal; a signal combination unit configured to combine the first shift signal and the second shift signal output from the switch unit and the test mode signal to generate a first combination signal and a second combination signal based on the combination; and a signal generation unit configured to receive the first combination signal and the second combination signal, and to generate the discrimination signal based thereon.

The shifter unit can include: a first shifter configured to shift the test mode signal in response to the reference clock signal, thereby outputting the first shift signal; and a second shifter configured to shift the first shift signal in response to the reference clock signal, thereby outputting the second shift signal.

The switch unit can include: a first switch configured to pass the first shift signal when the first comparison signal is at a first level; and a second switch configured to pass the second shift signal when the second comparison signal is at the first level.

The signal combination unit can include: a first signal combiner configured to change a voltage level of the first combination signal when the first shift signal output from the first switch changes in a voltage level in a state that the test mode signal is enable; and a second signal combiner configured to change a voltage level of the second combination signal when the second shift signal output from the second switch changes in a voltage level in a state that the test mode signal is enable.

The reference clock signal may be an external clock.

The internal clock signal may be a data output clock.

In still another aspect, a clock test method for a semiconductor integrated circuit including: applying different delay times to an internal clock to generate a plurality of delayed clocks; comparing the phase of a reference clock signal with the phase of each of the plurality of delayed clocks to generate a plurality of comparison signals; and generating a discrimination signal according to whether or not the level of each of the plurality of comparison signals is changed during a test mode.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 4A is a diagram showing the detailed configuration of a second example of the phase discrimination unit included in the apparatus shown in FIG. 1;

DETAILED DESCRIPTION

Figure 1:
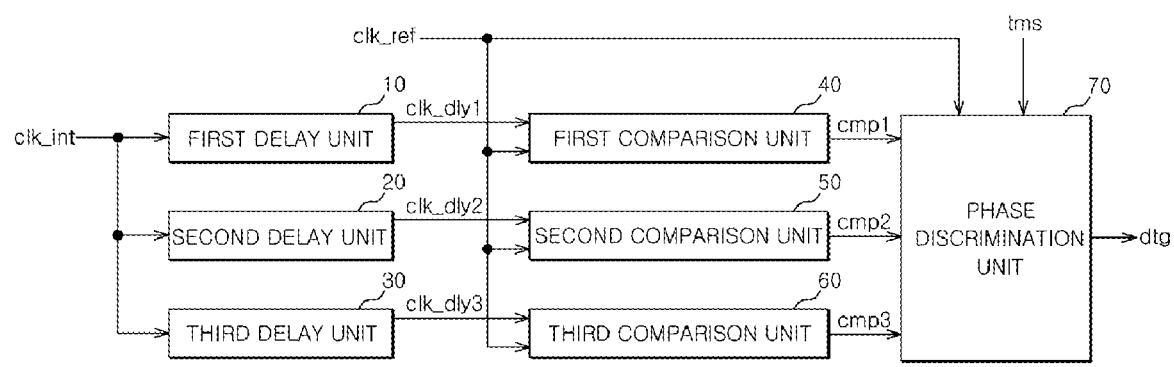
FIG. 1 is a block diagram showing the configuration of a clock test apparatus for a semiconductor integrated circuit according to an embodiment.

Referring to FIG. 1, a clock test apparatus 100 is shown that includes three delay units and three comparison units, and that is configured to determine the delay of an internal clock. It will be understood that the embodiment illustrated in FIG. 1 is intended as an example only and should not be seen as limiting in anyway. For example, a clock test apparatus configured in accordance with the embodiments described herein can include more delay units as required by a particular implementation.

Continuing with FIG. 1, the clock test apparatus 100 includes a first delay unit 10, a second delay unit 20, a third delay unit 30, a first comparison unit 40, a second comparison unit 50, a third comparison unit 60, and a phase discrimination unit 70.

The first delay unit 10 can be configured to apply a first delay to an internal clock signal (clk_int), thereby outputting a first delay clock signal (clk_dly1). The second delay unit 20 can be configured to apply a second delay to the internal clock signal (clk_int), thereby outputting a second delayed clock signal (clk_dly2). The third delay unit 30 can be configured to apply a third delay to the internal clock signal (clk_int), thereby outputting a third delayed clock signal (clk_dly3). The first comparison unit 40 can be configured to compare the phase of the first delayed clock signal (clk_dly1) with the phase of a reference clock signal (clk_ref), thereby outputting a first comparison signal (cmp1). The second comparison unit 50 can be configured to compare the phase of the second delayed clock signal (clk_dly2) with the phase of the reference clock signal (clk_ref), thereby outputting a second comparison signal (cmp2). The third comparison unit 60 can be configured to compare the phase of the third delayed clock signal (clk_dly3) with the phase of the reference clock signal (clk_ref), thereby outputting a third comparison signal (cmp3). The phase discrimination unit 70 can be configured to receive a test mode signal (tms), the reference clock signal (clk_ref), and the first to third comparison signals (cmp1), (cmp2), and (cmp3), and generate therefrom a discrimination signal (dtg).

The reference clock signal (clk_ref) can be derived from an external clock. The internal clock signal (clk_int) refers to an internal clock to be tested, such as a data output clock.

It is assumed that the third delay is longer than the second delay, and the second delay is longer than the first delay. For example, in one example embodiment, the first delay time can be −50 ps, the second delay time can be 0 ps, and the third delay time can be +50 ps.

If the reference clock signal (clk_ref) has a more advanced phase than the first delayed clock signal (clk_dly1) from the first delay unit 10, the first comparison unit 40 can be configured to drive the first comparison signal (cmp1) to an associated level (for example, high level). Further, if the first delayed clock signal (clk_dly1) has a more advanced phase than the reference clock signal (clk_ref), the first comparison unit 40 can be configured to drive the first comparison signal (cmp1) to the opposite level (for example, low level).

Similarly, the second comparison unit 50 or the third comparison unit 60 can be configured compare the phase of the second delayed clock signal (clk_dly2) and the third delayed clock signal (clk_dly3), respectively, with the phase of the reference clock signal (clk_ref), and generate the corresponding indication in the second comparison signal (cmp2) or the third comparison signal (cmp3), respectively.

Thus, if the reference clock signal (clk_ref) has a more advanced phase than the internal clock signal (clk_int) for 50 ps or more, then the first to third comparison signals (cmp1), (cmp2), and (cmp3) will all be at the first level, e.g., high.

If the reference clock signal (clk_ref) has a more advanced phase than the internal clock signal (clk_int) for 0 ps or more but less than 50 ps, then the first comparison signal (cmp1) will be low, and the second and third comparison signals (cmp2) and (cmp3) will be high.

If the internal clock signal (clk_int) has a more advanced phase than the reference clock signal (clk_ref) for 0 ps or more but less than 50 ps, then the first and second comparison signals (cmp1) and (cmp2) will be low, while the third comparison signal (cmp3) will be high.

If the internal clock signal (clk_int) has a more advanced phase than the reference clock signal (clk_ref) for 50 ps or more, then the first to third comparison signals (cmp1), (cmp2), and (cmp3) will all be low.

The phase discrimination unit 70 can be configured to detect a change in level of each of the first to third comparison signals (cmp1), (cmp2), and (cmp3), and generate the discrimination signal (dtg), which is enabled at a timing corresponding to the number of toggle times of the reference clock signal (clk_ref) after the test mode signal (tms) is enabled. That is, if the first to third comparison signals (cmp1), (cmp2), and (cmp3) are all at the first level, then the discrimination signal (dtg) is enabled at a first toggle timing of the reference clock signal (clk_ref) after the test mode signal (tms) is enabled. Further, if the first comparison signal (cmp1) is at the second level, and the second and third comparison signals (cmp2) and (cmp3) are at the first level, then the discrimination signal (dtg) is enabled at a second toggle timing of the reference clock signal (clk_ref) after the test mode signal (tms) is enabled. Similarly, if the first and the second comparison signals (cmp1) and (cmp2) are at the second level, and the third comparison signal (cmp3) is at the first level, then the discrimination signal (dtg) is enabled at a third toggle timing of the reference clock signal (clk_ref) after the test mode signal (tms) is enabled. If the first to third comparison signals (cmp1), (cmp2), and (cmp3) are all at the second level, then the discrimination signal (dtg) is not enabled.

As such, a tester can determine based on the enable timing of the discrimination signal (dtg) how much the internal clock signal (clk_int) is delayed from the external clock signal. A fuse circuit can then be used to correct the delay, thereby preventing defects in the semiconductor integrated circuit due to the delay of the internal clock signal (clk_int).

Figure 2:
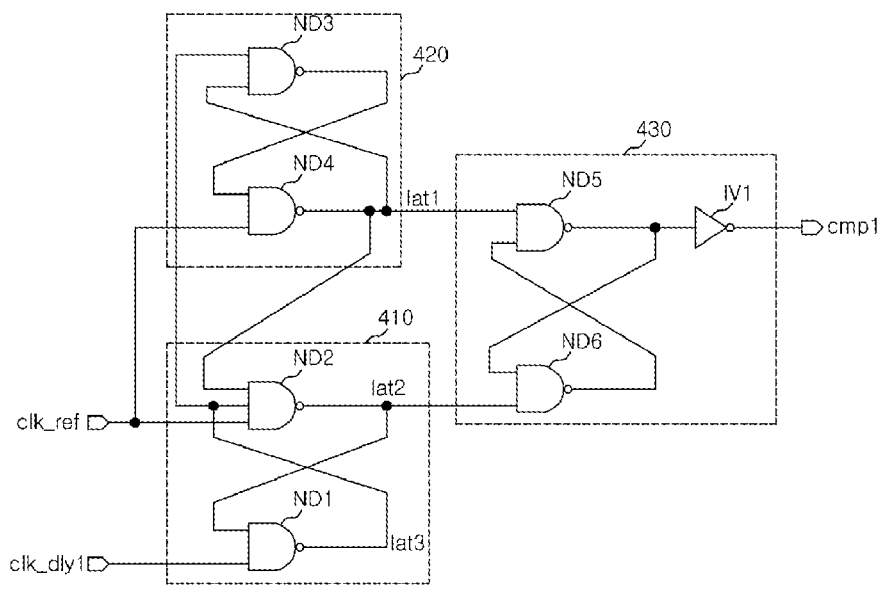
FIG. 2 is a diagram showing the detailed configuration of a first comparison unit included in the clock test apparatus shown in FIG. 1.

FIG. 2 is a schematic showing an example embodiment of the first comparison 40 unit shown in FIG. 1. The first to third comparison units 40, 50, and 60 have the same configuration, and thus the description of the first comparison unit 40 can be applied to the second and third comparison units 50 and 60.

As shown in FIG. 2, the first comparison unit 40 includes a first latch unit 410, a second latch unit 420, and a third latch unit 430.

The first latch unit 410 can be configured to receive the first delayed clock signal (clk_DLL), the reference clock signal (clk_ref), and a first latch signal (lat1), and to generate a second latch signal (lat2) and a third latch signal (lat3) therefrom. The first latch unit 410 can include a first NAND gate ND1 that receives the first delayed clock signal (clk_dly1) and the second latch signal (lat2), and outputs the third latch signal (lat3), and a second NAND gate ND2 that receives the reference clock signal (clk_ref), the first latch signal (lat1), and the third latch signal (lat3), and outputs the second latch signal (lat2).

The second latch unit 420 can be configured to receive the reference clock signal (clk_ref) and the third latch signal (lat3), and to generate the first latch signal (lat1) therefrom. The second latch unit 420 can include a third NAND gate ND3 that receives the first latch signal (lat1) and the third latch signal (lat3), and a fourth NAND gate ND4 that receives the reference clock signal (clk_ref) and an output signal of the third NAND gate ND3, and to generate the first latch signal (lat1).

The third latch unit 430 can be configured to receive the first latch signal (lat1) and the second latch signal (lat2), and to generate the first comparison signal (cmp1) therefrom. The third latch unit 430 can include a fifth NAND gate ND5 that receives the first latch signal (lat1) and an output signal of a sixth NAND gate ND6, the sixth NAND gate ND6 that receives the second latch signal (lat2) and an output signal of the fifth NAND gate ND5, and a first inverter IV1 that receives the output signal of the fifth NAND gate ND5 and outputs the first comparison signal (cmp1).

With this configuration, if the first delayed clock signal (clk_dly1) has a more advanced phase than the reference clock signal (clk_ref), then the first comparison signal (cmp1) is maintained at a low level. Meanwhile, if the reference clock signal (clk_ref) has a more advanced phase than the first delayed clock signal (clk_dly1), then the first comparison signal (cmp1) is at the high level at the rising edge of the reference clock signal (clk_ref). This state is maintained even if the voltage level of the reference clock signal (clk_ref) or the first delayed clock signal (clk_dly1) is changed.

Similarly, the second and third comparison units 50 and 60 compare the phases of the second delayed clock signal (clk_dly2) and the third delayed clock signal (clk_dly3), respectively, with the phase of the reference clock signal (clk_ref), thereby controlling the voltage levels of the second delayed clock signal (clk_dly2) and the third delayed clock signal (clk_dly3), respectively, according to the comparison results.

Figure 3A:
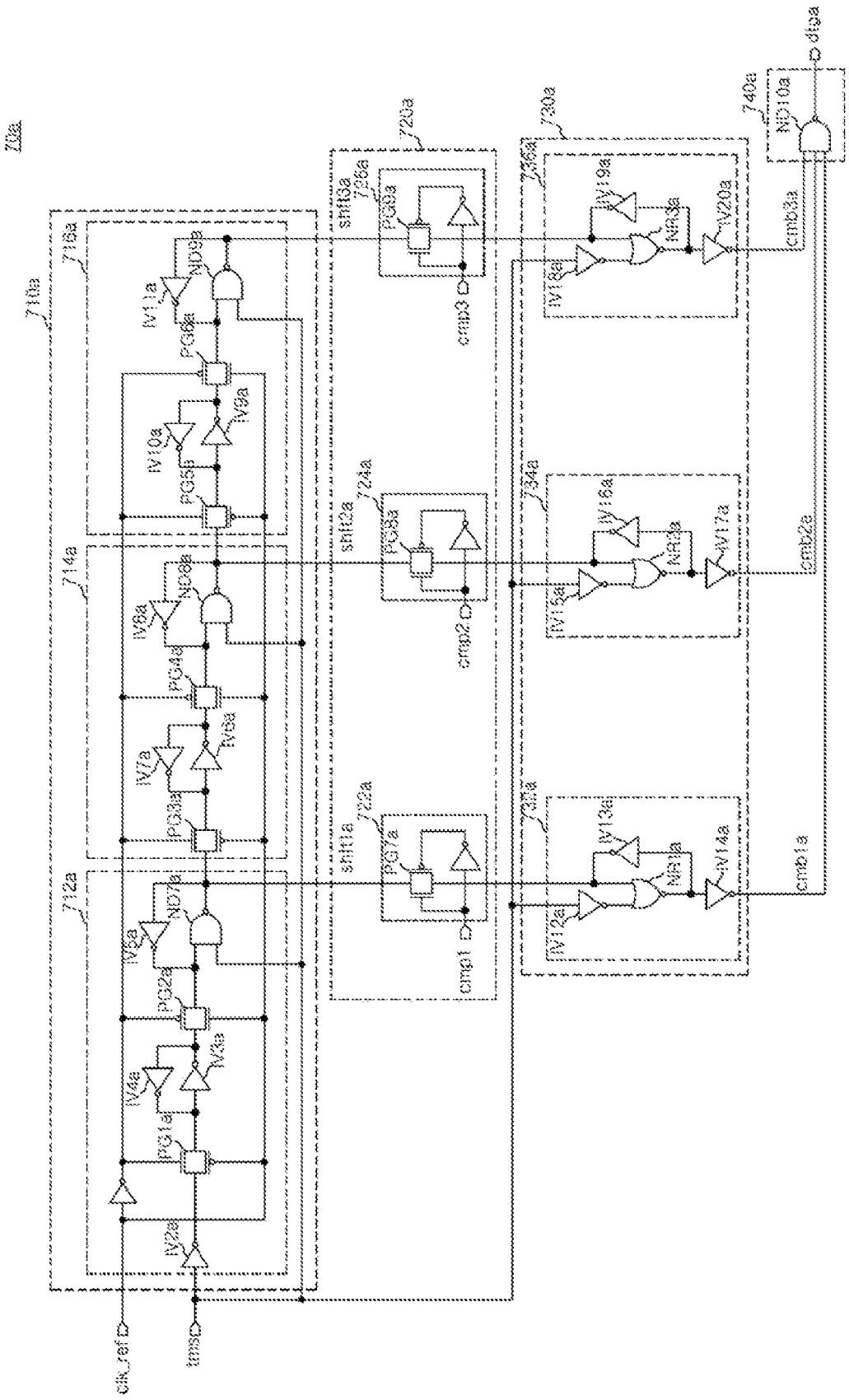
FIG. 3A is a diagram showing the detailed configuration of a first example of a phase discrimination unit included in the clock test apparatus shown in FIG. 1.

FIG. 3A is a schematic diagram showing the detailed configuration of an example embodiment of the phase discrimination unit 70a shown in FIG. 1. In the example of FIG. 3A, a phase discrimination unit 70a receive three comparison signals and generate a discrimination signal (dtg) corresponding to the number of toggle times of the reference clock signal (clk_ref). It will be understood, however, that phase discrimination unit 70a can be configured to receive more comparison signals, detects a change in level of each comparison signal, and outputs the detection result as a discrimination signal (dtg) corresponding to the number of toggle times of the reference clock signal (clk_ref).

Continuing with FIG. 3A, the phase discrimination unit 70a can include a shifter unit 710a, a switch unit 720a, a signal combination unit 730a, and a signal generation unit 740a.

The shifter unit 710a can be configured to shift the test mode signal (tms) in response to the reference clock signal (clk_ref), thereby outputting first to third shift signals (shft1a), (shft2a), and (shft3a). The shifter unit 710a can include a first shifter (712a), a second shifter (714a), and a third shifter (716a).

The first shifter (712a) can be configured to shift the test mode signal (tms) in response to the reference clock signal (clk_ref), thereby outputting the first shift signal (shft1a). The first shifter 712a can include a second inverter IV2a, a third inverter IV3a, a fourth inverter IV4a, a fifth inverter IV5a, a first pass gate PG1a, a second pass gate PG2a, and a seventh NAND gate ND7a.

The second inverter IV2a receives the test mode signal (tms). The first pass gate PG1a passes an output signal of the second inverter IV2a when the reference clock signal (clk_ref) is at a low level. The third inverter IV3a and the fourth inverter IV4a form a latch structure for an output signal of the first pass gate PG1a. The second pass gate PG2a passes an output signal of the third inverter IV3a when the reference clock signal (clk_ref) is at a high level. The seventh NAND gate ND7a receives an output signal of the second pass gate PG2a and the test mode signal (tms), and outputs the first shift signal (shft1a). The fifth inverter IV5a forms a latch structure with the seventh NAND gate ND7a.

The second shifter 714a shifts the first shift signal (shft1a) in response to the reference clock signal (clk_ref), thereby outputting the second shift signal (shft2a). The second shifter 714a includes a sixth inverter IV6a, a seventh inverter IV7a, an eighth inverter IV8a, a third pass gate PG3a, a fourth pass gate PG4a, and an eighth NAND gate ND8a.

The third pass gate PG3a passes the first shift signal (shft1a) when the reference clock signal (clk_ref) is at a low level. The sixth inverter IV6a and the seventh inverter IV7a forms a latch structure for an output signal of the third pass gate PG3a. The fourth pass gate PG4a passes an output signal of the sixth inverter IV6a when the reference clock signal (clk_ref) is at a high level. The eighth NAND gate ND8a receives an output signal of the fourth pass gate PG4a and the test mode signal (tms), and outputs the second shift signal (shft2a). The eighth inverter IV8a forms a latch structure with the eighth NAND gate ND8a.

The third shifter 716a shifts the second shift signal (shft2a) in response to the reference clock signal (clk_ref), thereby outputting the third shift signal (shft3a). The third shifter 716a includes a ninth inverter IV9a, a tenth inverter IV10a, an eleventh inverter IV11a, a fifth pass gate PG5a, a sixth pass gate PG6a, and a ninth NAND gate ND9a.

The fifth pass gate PG5a passes the second shift signal (shft2a) when the reference clock signal (clk_ref) is at a low level. The ninth inverter IV9a and the tenth inverter IV10a form a latch structure for an output signal of the fifth pass gate PG5a. The sixth pass gate PG6a passes an output signal of the ninth inverter IV9a when the reference clock signal (clk_ref) is at a high level. The ninth NAND gate ND9a receives an output signal of the sixth pass gate PG6a and the test mode signal (tms), and outputs the third shift signal (shft3a). The eleventh inverter IV11a forms a latch structure with the ninth NAND gate ND9a.

The switch unit 720a can be configured to control the output of the first to third shift signals (shft1a), (shft2a), and (shft3a) in response to the first to third comparison signals (cmp1), (cmp1), and (cmp3). The switch unit 720a can include a first switch 722a, a second switch 724a, and a third switch 726a.

The first switch 722a passes the first shift signal (shft1a) when the first comparison signal (cmp1) is at a high level. The first switch 722a includes a seventh pass gate PG7a.

The second switch 724a passes the second shift signal (shft2a) when the second comparison signal (cmp2) is at a high level. The second switch 724a includes an eighth pass gate PG8a.

The third switch 726a passes the third shift signal (shft3a) when the third comparison signal (cmp3) is at the high level. The third switch 726a includes a ninth pass gate PG9a.

The signal combination unit 730a can be configured to combine the test mode signal (tms) and an output signal of the switch unit 720a, thereby generating first to third combination signals (cmb1a), (cmb2a), and (cmb3a). The signal combination unit 730a includes a first signal combiner 732a, a second signal combiner 734a, and a third signal combiner 736a.

The first signal combiner 732a combines the test mode signal (tms) and an output signal of the first switch 722a, thereby generating the first combination signal (cmb1a). The first signal combiner 732a includes a twelfth inverter IV12a, a thirteenth inverter IV13a, a fourteenth inverter IV14a, and a first NOR gate NR1a.

The twelfth inverter IV12a receives the test mode signal (tms). The first NOR gate NR1a receives an output signal of the twelfth inverter IV12a and the output signal of the first switch 722a. The thirteenth inverter IV13a inverts an output signal of the first NOR gate NR1a and transmits the inverted output signal to an input terminal of the first NOR gate NR1a, to which the output signal of the first switch 722a is input. The fourteenth inverter IV14a receives the output signal of the first NOR gate NR1a and outputs the first combination signal (cmb1a).

The second signal combiner 734a combines the test mode signal (tms) and an output signal of the second switch 724a, thereby generating the second combination signal (cmb2a). The second signal combiner 734a includes a fifteenth inverter IV15a, a sixteenth inverter IV16a, a seventeenth inverter IV17a, and a second NOR gate NR2a.

The fifteenth inverter IV15a receives the test mode signal (tms). The second NOR gate NR2a receives an output signal of the fifteenth inverter IV15a and the output signal of the second switch 724a. The sixteenth inverter IV16a inverts an output signal of the second NOR gate NR2a and transmits the inverted output signal to an input terminal of the second NOR gate NR2a, to which the output signal of the second switch 724a is input. The seventeenth inverter IV17a receives the output signal of the second NOR gate NR2a and outputs the second combination signal (cmb2a).

The third signal combiner 736a combines the test mode signal (tms) and an output signal of the third switch 726a, thereby generating the third combination signal (cmb3a). The third signal combiner 736a includes an eighteenth inverter IV18a, a nineteenth inverter IV19a, a twentieth inverter IV20a, and a third NOR gate NR3a.

The eighteenth inverter IV18a receives the test mode signal (tms). The third NOR gate NR3a receives an output signal of the eighteenth inverter IV18a and the output signal of the third switch 726a. The nineteenth inverter IV19a inverts an output signal of the third NOR gate NR3a and transmits the inverted output signal to an input terminal of the third NOR gate NR3a, to which the output signal of the third switch 726a is input. The twentieth inverter IV20a receives the output signal of the third NOR gate NR3a and outputs the third combination signal cmb3a.

The signal generation unit 740a can be configured to receive the first to third combination signals (cmb1a), (cmb2a), and (cmb3a), and generates a discrimination signal (dtga). The signal generator 740a includes a tenth NAND gate ND10a.

In the phase discrimination unit 70a of FIG. 3A, if the test mode signal (tms) is disabled, the first to third combination signals (cmb1a), (cmb2a), and (cmb3a) are all high, and the discrimination signal (dtga) is disabled, or low.

Meanwhile, if the test mode signal (tms) is enabled, the first to third signal combiners 732a, 734a, and 736a determine the voltage levels of the first to third combination signals (cmb1a), (cmb2a), and (cmb3a) based on the output of the first to third switches 722a, 724a, and 726a.

If the test mode signal (tms) is enabled, the first shift signal (shft1a) goes low when the reference clock signal (clk_ref) transitions from low to high. Subsequently, the second shift signal (shft2a) goes low when the reference clock signal (clk_ref) transitions from low to high again, and the third shift signal (shft3a) goes low when the reference clock signal (clk_ref) goes from low to high yet again.

Thus, for example, if only the third comparison signal (cmp3) is high, the first and second switches 722a and 724a will block the output of the first and second shift signals (shft1a) and (shft2a), respectively. Therefore, the first combiner 732a will output the first combination signal (cmb1a) at a high level by the latch of the first NOR gate NR1a and the thirteenth inverter IV13a, and the second signal combiner 734a outputs the second combination signal (cmb2a) at a high level by the latch of the second NOR gate NR2a and the sixteenth inverter IV16a.

At this time, meanwhile, the third switch 726a passes the third shift signal (shft3a). Accordingly, the third shift signal (shft3a), which will be low, is transmitted to the third signal combiner 736a, and thus the third combination signal (cmb3a) goes low.

As the third combination signal (cmb3a) goes low, the signal generation unit 740a will cause the discrimination signal (dtga) to go high.

That is, when only the third comparison signal (cmp3) is high, after the test mode signal (tms) is enabled, the third shift signal (shft3a) that is generated at a third rising edge timing of the reference clock signal (clk_ref) follows a change in level of the third combination signal (cmb3a) and the discrimination signal (dtga). As described above, the timing at which the discrimination signal (dtga) is changed is determined according to which of the first to third comparison signals (cmp1), (cmp2), and (cmp3) is changed to a high level. Therefore, the tester can discriminate a difference in phase between the internal clock signal (clk_int) and the reference clock signal (clk_ref).

Figure 3B:
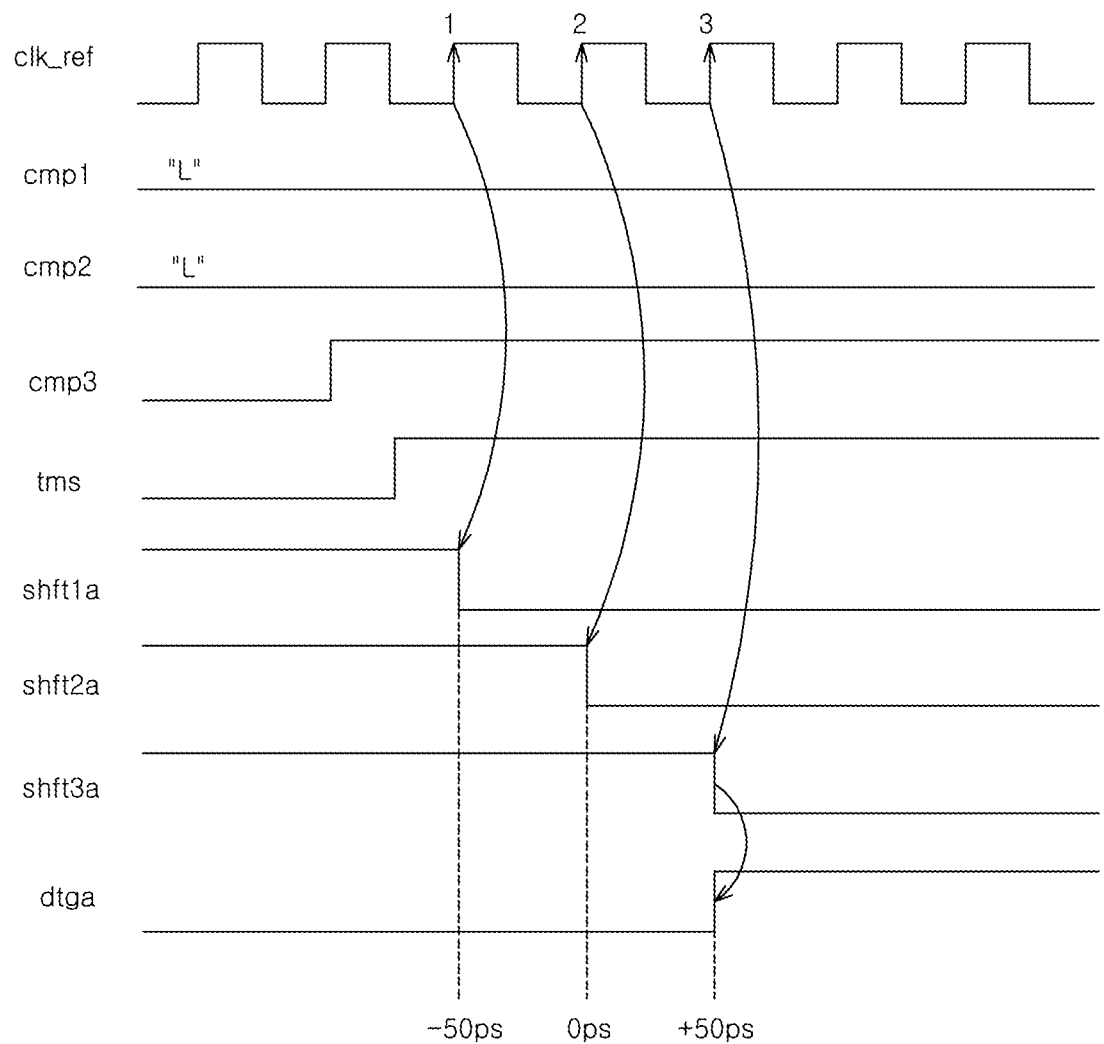
FIG. 3B is a timing chart illustrating the operation of a clock test apparatus for a semiconductor integrated circuit that includes the phase discrimination unit shown in FIG. 3A.

FIG. 3B is a timing chart illustrating the operation of a clock test apparatus 70a that includes the phase discrimination unit shown in FIG. 3A. FIG. 3B shows the waveforms of individual signals when only the third comparison signal (cmp3) goes high, as described above.

Referring to FIG. 3B, it can be seen that the first and second comparison signals (cmp1) and (cmp2) are maintained at a low level, and while the third comparison signal (cmp3) transitions to a high level. If the test mode signal (tms) is enabled while the third comparison signal (cmp3) is high, it can be seen that the first to third shift signals (shft1a), (shft2a), and (shft3a) are sequentially changed to the low level each time the reference clock signal (clk_ref) is enabled. Here, since the level of the third comparison signal (cmp3) is changed, the discrimination signal (dtga) is enabled at a timing at which the level of the third shift signal (shft3a) is changed. In this case, as described above and on an assumption that the first to third comparison signals (cmp1), (cmp2), and (cmp3) represent a difference in phase between the reference clock signal (clk_ref) and the internal clock signal (clk_int) at intervals of 50 ps, the internal clock signal (clk_int) has a more advanced phase than the reference clock signal (clk_ref) for 0 ps or more but less than 50 ps.

If the level of the first to third comparison signal (cmp1), (cmp2), and (cmp3) are changed, the discrimination signal (dtga) is enabled at a timing at which the level of the first shift signal (shft1a) changes. Therefore, the reference clock signal (clk_ref) has a more advanced phase than the internal clock signal (clk_int) for 50 ps or more.

Similarly, if the levels of the second and third comparison signals (cmp2) and (cmp3) are changed, the discrimination signal (dtga) is enabled at a timing at which the level of the second shift signal (shft2a) is changed. Then, it can be determined that the reference clock signal (clk_ref) has a more advanced than the internal clock signal (clk_int) for 0 ps or more but less than 50 ps.

FIG. 4A is a diagram showing the detailed configuration of a second example embodiment of the phase discrimination unit 70b that can be included in the apparatus 100 shown in FIG. 1. As with discrimination unit 70, phase discrimination unit 70b receives three comparison signals.

As shown in FIG. 4A, a phase discrimination unit 70b can include a shifter unit 710b, a switch unit 720b, a signal combination unit 730b, and a signal generation unit 740b.

The shifter unit 710b can be configured to shift the test mode signal (tms) in response to the reference clock signal (clk_ref), thereby outputting first to third shift signals (shft1b), (shft2b), and (shft3b). The shifter unit 710b includes a first shifter 712b, a second shifter 714b, and a third shifter 716b.

The first shifter 712b shifts the test mode signal (tms) in response to the reference clock signal (clk_ref), thereby outputting the first shift signal (shft1b). The first shifter 712b includes a second inverter IV2b, a third inverter IV3b, a fourth inverter IV4b, a fifth inverter IV5b, and a first pass gate PG1b.

The second inverter IV2b receives the test mode signal (tms). The first pass gate PG1b passes an output signal of the second inverter IV2b when the reference clock signal (clk_ref) is low. The third inverter IV3b receives an output signal of the first pass gate PG1b. The fourth inverter IV4b forms a latch structure for the third inverter IV3b. The fifth inverter IV5b receives an output signal of the third inverter IV3b and outputs the first shift signal (shft1b).

The second shifter 714b shifts the first shift signal (shft1b) in response to the reference clock signal (clk_ref), thereby outputting the second shift signal (shft2b). The second shifter 714b includes a second pass gate PG2b, a seventh NAND gate ND7b, and a sixth inverter IV6b.

The second pass gate PG2b passes the first shift signal (shft1b) when the reference clock signal (clk_ref) is high. The seventh NAND gate ND7b receives an output signal of the second pass gate PG2b and the test mode signal (tms), and outputs the second shift signal (shft2b). The sixth inverter IV6b forms a latch structure with the seventh NAND gate ND7b.

The third shifter 716b shifts the second shift signal (shft2b) in response to the reference clock signal (clk_ref), thereby outputting the third shift signal (shft3b). The third shifter 716b includes a third pass gate PG3b, a seventh inverter IV7b, an eighth inverter IV8b, and a ninth inverter IV9b.

The third pass gate PG3b passes the second shift signal (shft2b) when the reference clock signal (clk_ref) is low. The seventh inverter IV7b receives an output signal of the third pass gate PG3b. The eighth inverter IV8b forms a latch structure together with the seventh inverter IV7b. The ninth inverter IV9b receives an output signal of the seventh inverter IV7b and outputs the third shift signal (shft3b).

The switch unit 720b can be configured to control the output of the first to third shift signals (shft1b), (shft2b), and (shft3b) in response to the first to third comparison signals (cmp1), (cmp1), and (cmp3). The switch unit 720b includes a first switch 722b, a second switch 724b, and a third switch 726b.

The first switch 722b passes the first shift signal (shft1b) when the first comparison signal (cmp1) is high. The first switch 722b includes a fourth pass gate PG4b.

The second switch 724b passes the second shift signal (shft2b) when the second comparison signal (cmp2) is high. The second switch 724b includes a fifth pass gate PG5b.

The third switch 726b passes the third shift signal (shft3b) when the third comparison signal (cmp3) is high. The third switch 726b includes a sixth pass gate PG6b.

The signal combination unit 730b can be configured to combine the test mode signal (tms) and an output signal of the switch unit 720b, thereby generating first to third combination signals (cmb1b), (cmb2b), and (cmb3b). The signal combination unit 730b includes a first signal combiner 732b, a second signal combiner 734b, and a third signal combiner 736b.

The first signal combiner 732b combines the test mode signal (tms) and an output signal of the first switch 722b, thereby generating the first combination signal (cmb1b). The first signal combiner 732b includes a tenth inverter IV10b, an eleventh inverter IV11b, a twelfth inverter IV12b, and a first NOR gate NR1b.

The tenth inverter IV10b receives the test mode signal (tms). The first NOR gate NR1b receives an output signal of the tenth inverter IV10b and the output signal of the first switch 722b. The eleventh inverter IV11b inverts an output signal of the first NOR gate NR1b and transmits the inverted output signal to an input terminal of the first NOR gate NR1b, to which the output signal of the first switch 722b is input. The twelfth inverter IV12b receives the output signal of the first NOR gate NR1b and outputs the first combination signal (cmb1b).

The second signal combiner 734b combines the test mode signal (tms) and an output signal of the second switch 724b, thereby generating the second combination signal (cmb2b). The second signal combiner 734b includes a thirteenth inverter IV13b, a fourteenth inverter IV14b, a fifteenth inverter IV15b, and a second NOR gate NR2b.

The thirteenth inverter IV13b receives the test mode signal (tms). The second NOR gate NR2b receives an output signal of the thirteenth inverter IV13b and the output signal of the second switch 724b. The fourteenth inverter IV14b inverts an output signal of the second NOR gate NR2b and transmits the inverted output signal to an input terminal of the second NOR gate NR2b, to which the output signal of the second switch 724b is input. The fifteenth inverter IV15b receives the output signal of the second NOR gate NR2b and outputs the second combination signal (cmb2b).

The third signal combiner 736b combines the test mode signal (tms) and an output signal of the third switch 726b, thereby generating the third combination signal (cmb3b). The third signal combiner 736b includes a sixteenth inverter IV16b, a seventeenth inverter IV17b, an eighteenth inverter IV18b, and a third NOR gate NR3b.

The sixteenth inverter IV16b receives the test mode signal (tms). The third NOR gate NR3b receives an output signal of the sixteenth inverter IV16b and an output signal of the third switch 726b. The seventeenth inverter IV17b inverts an output signal of the third NOR gate NR3b and transmits the inverted output signal to an input terminal of the third NOR gate NR3b, to which the output signal of the third switch 726b is input. The eighteenth inverter IV18b receives the output signal of the third NOR gate NR3b and outputs the third combination signal (cmb3b).

The signal generation unit 740b receives the first to third combination signals (cmb1b), (cmb2b), and (cmb3b), thereby generating a discrimination signal (dtgb). The signal generator 740b includes an eighth NAND gate ND8b.

Figure 4B:
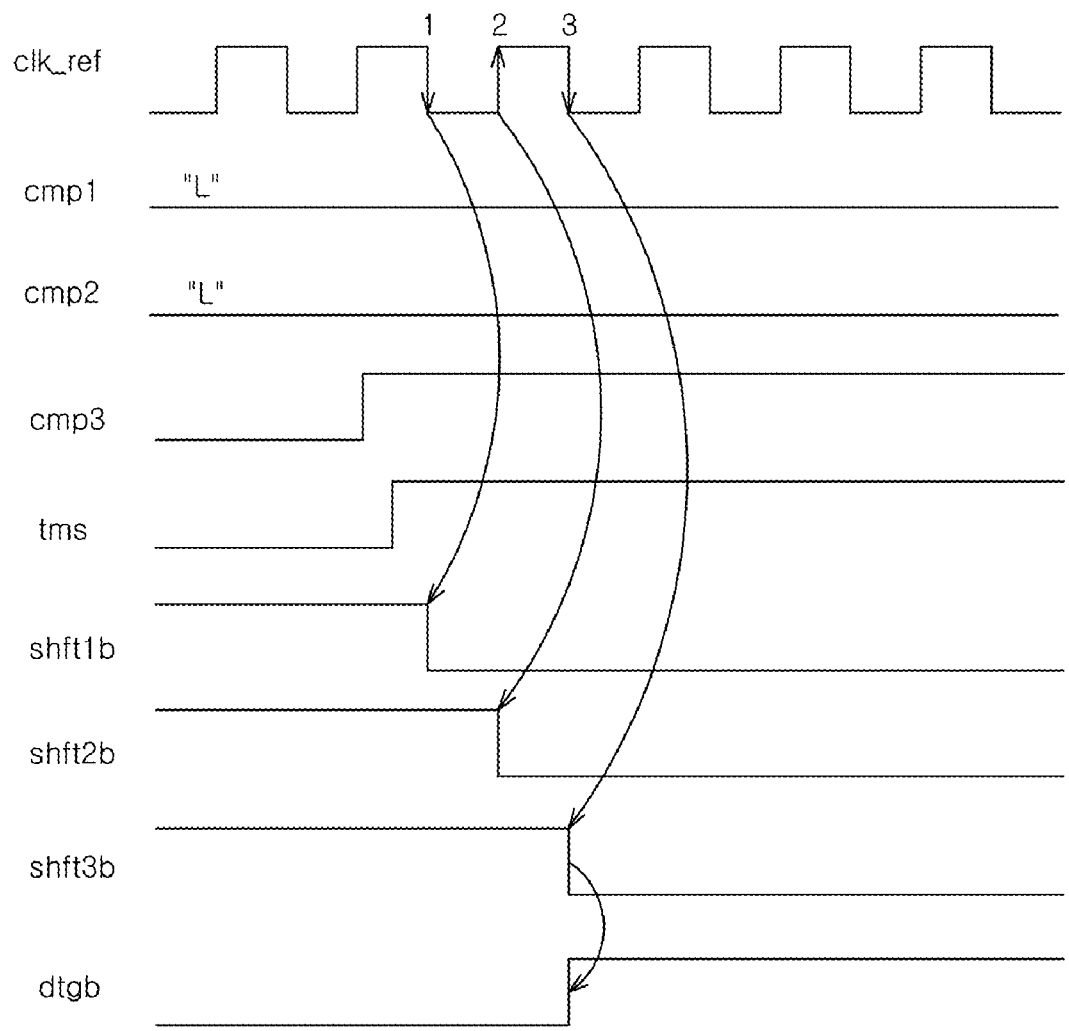
FIG. 4B is a timing chart illustrating the operation a clock test apparatus for a semiconductor integrated circuit that includes the phase discrimination unit shown in FIG. 4A.

FIG. 4B is a timing chart illustrating the operation of a clock test apparatus that includes the phase discrimination unit shown in FIG. 4A. FIG. 4B shows the waveforms of individual signals when only the third comparison signal (cmp3) is changed to the high level.

Referring to FIG. 4B, a change in level of each of the first to third shift signals (shft1b), (shft2b), and (shft3b) and enabling of the discrimination signal (dtgb) according to a change in level of each of the third comparison signal (cmp3) and the test mode signal (tms) is as described with reference to FIG. 3B. In this example, however, a timing at which the discrimination signal (dtgb) is enabled is measured on the basis of half cycle of the clock, thereby reducing a time required for a clock test.

Figure 5:
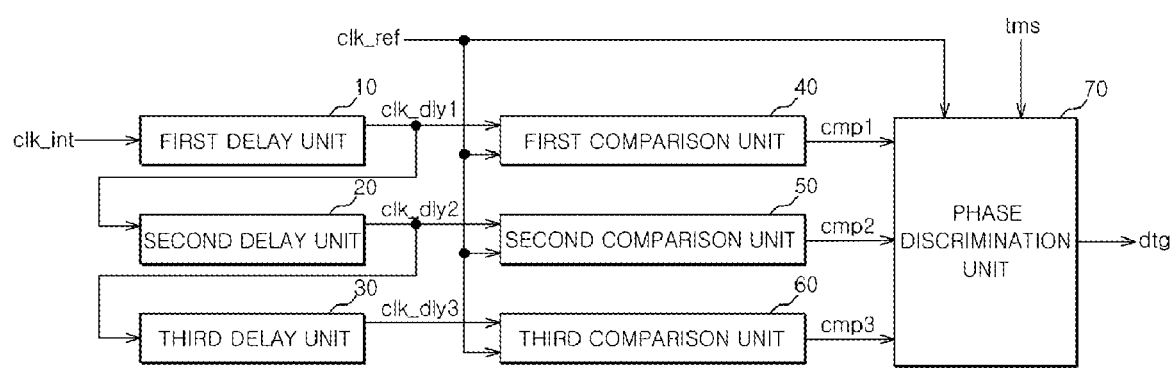
FIG. 5 is a block diagram showing an example clock test apparatus for a semiconductor integrated circuit according to another embodiment.

FIG. 5 is a block diagram showing the configuration of a clock test apparatus 200 for a semiconductor integrated circuit according to another embodiment. Similar to the above-described embodiment, the clock test apparatus 200 includes three delay units and three comparison units, thereby discriminating the delay amount of the internal clock by four divisions.

As shown in FIG. 5, the clock test apparatus includes a first delay unit 10, a second delay unit 20, a third delay unit 30, a first comparison unit 40, a second comparison unit 50, a third comparison unit 60, and a phase discrimination unit 70.

The first delay unit 10 can be configured delay an internal clock signal (clk_int), thereby outputting a first delayed clock signal (clk_dly1). The second delay unit 20 can be configured to delay the first delayed clock signal (clk_dly1), thereby outputting a second delayed clock signal (clk_dly2). The third delay unit 30 can be configured delay the second delayed clock signal (clk_dly2), thereby outputting a third delayed clock signal (clk_dly3). The first comparison unit 40 can be configured to compare the phase of the first delayed clock signal (clk_dly1) with the phase of a reference clock signal (clk_ref), thereby outputting a first comparison signal (cmp1). The second comparison unit 50 can be configured to compare the phase of the second delayed clock signal (clk_dly2) with the phase of the reference clock signal (clk_ref), thereby outputting a second comparison signal (cmp2). The third comparison unit 60 can be configured to compare the phase of the third delayed clock signal (clk_dly3) with the phase of the reference clock signal (clk_ref), thereby outputting a third comparison signal (cmp3). The phase discrimination unit 70 can be configured to receive a test mode signal (tms), the reference clock signal (clk_ref), and the first to third comparison signals (cmp1), (cmp2), and (cmp3), and to generate a discrimination signal (dtg) therefrom.

It is assumed that the first to third delay units 10 to 30 apply the same delay time to the clock to be input. For example, if each delay unit has the delay amount of 50 ps, the first delayed clock signal (clk_dly1) is delayed from the internal clock signal (clk_int) for 50 ps, the second delayed clock signal (clk_dly2) is delayed from the internal clock signal (clk_int) for 100 ps, and the third delayed clock signal (clk_dly3) is delayed from the internal clock signal (clk_int) for 150 ps.

The configuration of each of the first comparison unit 40, the second comparison unit 50, the third comparison unit 60, and the phase discrimination unit 70 is the same configuration as those in the embodiment described with reference to FIG. 1 to FIG. 4B. The clock test apparatus for a semiconductor integrated circuit according to this embodiment has the delay units having the same delay amount, such that the area can be efficiently used.

As described above, the clock test apparatus for a semiconductor integrated circuit according to the embodiment of FIG. 5 applies different delay times to the internal clock to generate a plurality of delayed clocks, compares the phase of the reference clock and the phase of each of the plurality of delayed clocks, thereby generating a plurality of comparison signals. Next, if the test mode signal is enabled, a change in level of each of the plurality of comparison signals is represented by an enable timing of the discrimination signal based on the reference clock. Accordingly, the tester can obtain information on the difference in phase between the internal clock and the reference clock, that is, information on the delay amount of the internal clock with respect to the external clock. Subsequently, the tester can control a fuse circuit to effectively eliminate the delay of the internal clock.

Therefore, when the clock test apparatus for a semiconductor integrated circuit according to the embodiment described herein is implemented, it is possible to test the difference in phase between the internal clock and the external clock while in the wafer state. As a result, the delay of the internal clock can be corrected, and yield of the semiconductor integrated circuit can be improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A clock test apparatus for a semiconductor integrated circuit, comprising:
   a delay unit configured to delay an internal clock signal;
   a comparison unit configured to compare the phase of an output signal of the delay unit with the phase of a reference clock signal; and
   a phase discrimination unit configured to receive a test mode signal, the reference clock signal, and an output signal of the comparison unit, and to generate a discrimination signal based thereon.

2. The clock test apparatus of claim 1,
wherein the comparison unit is configured to output a comparison signal at a first level when the reference clock signal has a more advanced phase than the output signal of the delay unit, and to output the comparison signal at a second level when the output signal of the delay unit has a more advanced phase than the reference clock signal.

3. The clock test apparatus of claim 2,
wherein the comparison unit comprises:
a first latch unit configured to receive the output signal of the delay unit, the reference clock signal, and a first latch signal, and to generate a second latch signal and a third latch signal based thereon;
a second latch unit configured to receive the reference clock signal and the third latch signal, thereby outputting the first latch signal; and
a third latch unit configured to receive the first latch signal and the second latch signal, and to generate the comparison signal based thereon.

4. The clock test apparatus of claim 1,
wherein the phase discrimination unit is configured to detect a change in level of the comparison signal, thereby generating the discrimination signal that is enabled at a timing corresponding to a number of toggle times of the reference clock signal after the test mode signal is enabled.

5. The clock test apparatus of claim 4,
wherein the phase discrimination unit comprises:
a shifter unit configured to shift the test mode signal in response to the reference clock signal, thereby generating a shift signal;
a switch unit configured to control the output of the shift signal in response to the comparison signal;
a signal combination unit configured to combine the test mode signal and an output signal of the switch unit, and generate a combination signal; and
a signal generation unit configured to receive the combination signal, and generate the discrimination signal based thereon.

6. A clock test apparatus for a semiconductor integrated circuit, comprising:
a first delay unit configured to delay an internal clock signal by a first delay value to generate a first delay clock signal;
a second delay unit configured to delay the internal clock signal by a second delay value to generate a second delayed clock;
a first comparison unit configured to compare the phase of the first delay clock signal with the phase of a reference clock signal, and generating a first comparison signal based on the comparison;
a second comparison unit configured to compare the phase of the second delayed clock with the phase of the reference clock signal, and to generate a second comparison signal based on the comparison; and
a phase discrimination unit configured to detect a change in level of each of the first comparison signal and the second comparison signal, and to determine a difference in phase between the reference clock signal and the internal clock signal.

7. The clock test apparatus of claim 6,
wherein the first delay value and the second delay value are different from each other.

8. The clock test apparatus of claim 6,
wherein the first comparison unit is configured to output the first comparison signal at a first level when the reference clock signal has a more advanced phase than the first delay clock signal, and to output the first comparison signal at a second level when the first delay clock signal has a more advanced phase than the reference clock signal.

9. The clock test apparatus of claim 8,
wherein the first comparison unit comprises:
a first latch unit configured to receive the first delay clock signal, the reference clock signal, a first latch signal, and to generate a second latch signal and a third latch signal based thereon;
a second latch unit configured to receive the reference clock signal and the third latch signal, and to generate the first latch signal based thereon; and
a third latch unit configured to receive the first latch signal and the second latch signal, and to generate the first comparison signal based thereon.

10. The clock test apparatus of claim 6,
wherein the second comparison unit is configured to output the second comparison signal at a first level when the reference clock signal has a more advanced phase than the second delayed clock, and to output the second comparison signal at a second level when the second delayed clock has a more advanced phase than the reference clock signal.

11. The clock test apparatus of claim 10,
wherein the second comparison unit comprises:
a first latch unit configured to receive the second delayed clock, the reference clock signal, and a first latch signal, and to generate a second latch signal and a third latch signal based thereon;
a second latch unit configured to receive the reference clock signal and the third latch signal, and to generate the first latch signal based thereon; and
a third latch unit configured to receive the first latch signal and the second latch signal, and to generate the second comparison signal based thereon.

12. The clock test apparatus of claim 6,
wherein the phase discrimination unit is configured to detect a change in level of each of the first comparison signal and the second comparison signal, and to generate a discrimination signal based thereon that is enabled at a timing corresponding to the number of changes in level of the reference clock signal during a test mode.

13. The clock test apparatus of claim 12,
wherein the phase discrimination unit comprising:
a shifter unit configured to shift a test mode signal in response to the reference clock signal, and to generate a first shift signal and a second shift signal based thereon;
a switch unit configured to selectively output the first shift signal or the second shift signal in response to the first comparison signal and the second comparison signal;
a signal combination unit configured to combine the first shift signal and the second shift signal output from the switch unit and the test mode signal to generate a first combination signal and a second combination signal based on the combination; and
a signal generation unit configured to receive the first combination signal and the second combination signal, and to generate the discrimination signal based thereon.

14. A clock test apparatus for a semiconductor integrated circuit, comprising:
a first delay unit configured to delay an internal clock signal to generate a first delay clock signal;
a second delay unit configured to delay the first delay clock signal to generate a second delay clock signal;

a first comparison unit configured to compare the phase of the first delay clock signal with the phase of a reference clock signal, and to generate a first comparison signal based thereon;

a second comparison unit configured to compare the phase of the second delay clock signal with the phase of the reference clock signal, and to generate a second comparison signal based thereon; and a phase discrimination unit configured to detect a change in level of each of the first comparison signal and the second comparison signal, and to determine a difference in phase between the reference clock signal and the internal clock signal.

15. The clock test apparatus of claim 14,
wherein the first comparison unit is configured to output the first comparison signal at a first level when the reference clock signal has a more advanced phase than the first delay clock signal, and to output the first comparison signal at a second level when the first delay clock signal has a more advanced phase than the reference clock signal.

16. The clock test apparatus of claim 15,
wherein the first comparison unit comprises:

a first latch unit configured to receive the first delay clock signal, the reference clock signal, a first latch signal, and to generate a second latch signal and a third latch signal based thereon;

a second latch unit configured to receive the reference clock signal and the third latch signal, and to generate the first latch signal based thereon; and a third latch unit configured to receive the first latch signal and the second latch signal, and to generate the first comparison signal based thereon.

17. The clock test apparatus of claim 14,
wherein the second comparison unit is configured to output the second comparison signal at a first level when the reference clock signal has a more advanced phase than the second delay clock signal, and to output the second comparison signal at a second level when the second delay clock signal has a more advanced phase than the reference clock signal.

18. The clock test apparatus of claim 17,
wherein the second comparison unit comprises:

a first latch unit configured to receive the second delay clock signal, the reference clock signal, and a first latch signal, and to generate a second latch signal and a third latch signal based thereon;

a second latch unit configured to receive the reference clock signal and the third latch signal, and to generate the first latch signal based thereon; and a third latch unit configured to receive the first latch signal and the second latch signal, and to generate the second comparison signal based thereon.

19. The clock test apparatus of claim 14,
wherein the phase discrimination unit is configured to detect a change in level of each of the first comparison signal and the second comparison signal, thereby generating a discrimination signal that is enabled at a timing corresponding to the number of changes in level of the reference clock signal during a test mode.

20. The clock test apparatus of claim 19,
wherein the phase discrimination unit comprises:

a shifter unit configured to shift a test mode signal in response to the reference clock signal, and to generate a first shift signal and a second shift signal based thereon;

a switch unit configured to selectively output the first shift signal or the second shift signal in response to the first comparison signal and the second comparison signal;

a signal combination unit configured to combine the first shift signal and the second shift signal output from the switch unit and the test mode signal to generate a first combination signal and a second combination signal; and a signal generation unit configured to receive the first combination signal and the second combination signal, and to generate the discrimination signal based thereon.

21. A clock test method for a semiconductor integrated circuit, comprising:

applying different delay times to an internal clock signal to generate a plurality of delayed clock signals;

comparing the phase of a reference clock signal and the phase of each of the plurality of delayed clock signals to generate a plurality of comparison signals; and generating a discrimination signal according to whether or not the level of each of the plurality of comparison signals is changed during a test mode.

22. The clock test method of claim 21,
wherein the generating of the comparison signal comprises comparing the phase of each of the plurality of delayed clock signals with the phase of the reference clock signal, thereby outputting the comparison signal at a first level if the reference clock signal has an advanced phase, and thereby outputting the comparison signal at a second level if the reference clock signal has a lagged phase.

23. The clock test method of claim 21,
wherein the generating of the discrimination signal comprises detecting a change in level of each of the plurality of comparison signals, thereby generating the discrimination signal that is enabled at a timing corresponding to the number of toggle times of the reference clock signal during a test mode.

24. The clock test method of claim 21,
wherein the reference clock signal is an external clock.

25. The clock test method of claim 21,
wherein the internal clock signal is a data output clock.

* * * * *